United States Patent [19]
Ciccone et al.

[11] Patent Number: 6,069,495
[45] Date of Patent: May 30, 2000

[54] HIGH-SPEED LOGIC EMBODIED DIFFERENTIAL DYNAMIC CMOS TRUE SINGLE PHASE CLOCK LATCHES AND FLIP-FLOPS WITH SINGLE TRANSISTOR CLOCK LATCHES

[75] Inventors: John C. Ciccone, Scottsdale; D. C. Sessions, Phoenix, both of Ariz.

[73] Assignee: VSLI Technology, Inc., San Jose, Calif.

[21] Appl. No.: 08/976,190

[22] Filed: Nov. 21, 1997

[51] Int. Cl.[7] .................. H03K 19/096; H03K 19/0948
[52] U.S. Cl. ............................ 326/98; 326/17; 326/113; 326/121
[58] Field of Search ...................... 326/93, 95, 98, 326/112, 119, 121, 17, 113; 327/202–203, 26–211

[56] References Cited

U.S. PATENT DOCUMENTS

| | | | |
|---|---|---|---|
| 4,570,084 | 2/1986 | Griffin et al. | 326/115 |
| 4,620,117 | 10/1986 | Fang | 326/113 |
| 4,716,312 | 12/1987 | Mead et al. | 327/211 |
| 5,023,480 | 6/1991 | Gieseke et al. | 326/98 |
| 5,841,298 | 11/1998 | Huang | 326/115 |

*Primary Examiner*—Jon Santamauro
*Attorney, Agent, or Firm*—Burns, Doane, Swecker & Mathis, L.L.P.

[57] ABSTRACT

A differential true single phase latch and flip-flop designed to embody logic functions is described. The logic function embodied latch includes a first circuit branch including first input switching devices for receiving a first set of input signals which include input signals and their corresponding complements and for outputting a first output signal having a logic state representative of the results of a logic function performed on said first set of input signals and a second circuit branch including second input switching devices for receiving the complement of the at least two input signals and can include the at least two input signals and for outputting a non-inverted output signal. First and second input switching devices are configured so as to cause the latch to perform logic functions on the input signals and latch output states corresponding to the results logic functions on its non-inverted and inverted outputs in the same clock phase.

20 Claims, 8 Drawing Sheets

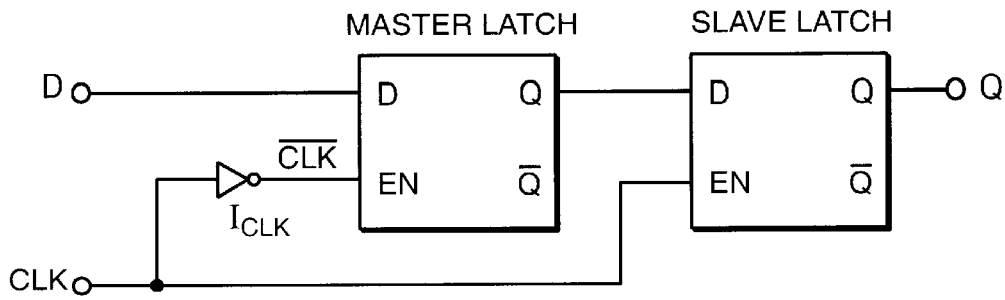
FIG._1
*(PRIOR ART)*
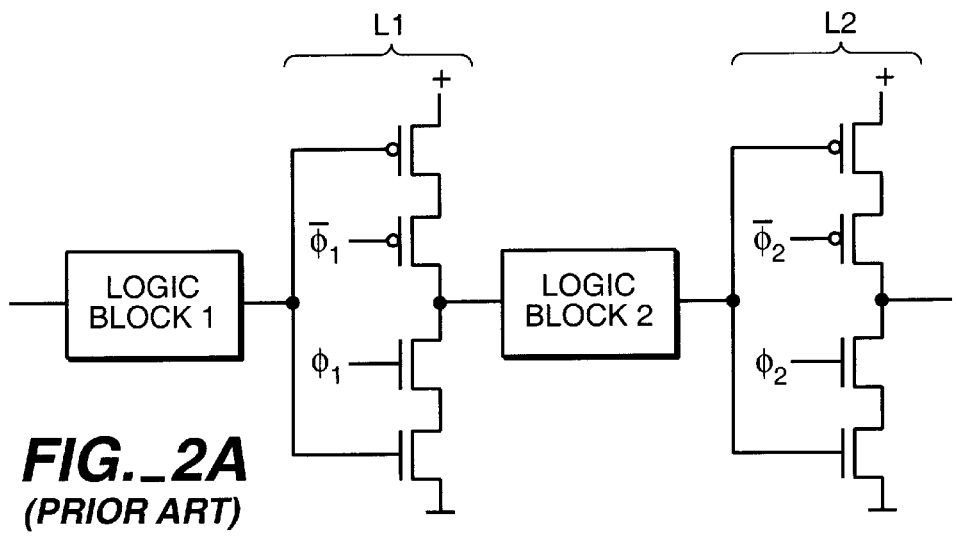
FIG._2A
*(PRIOR ART)*
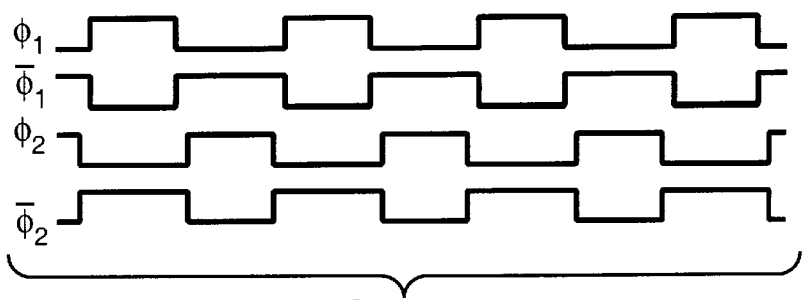
FIG._2B
*(PRIOR ART)*

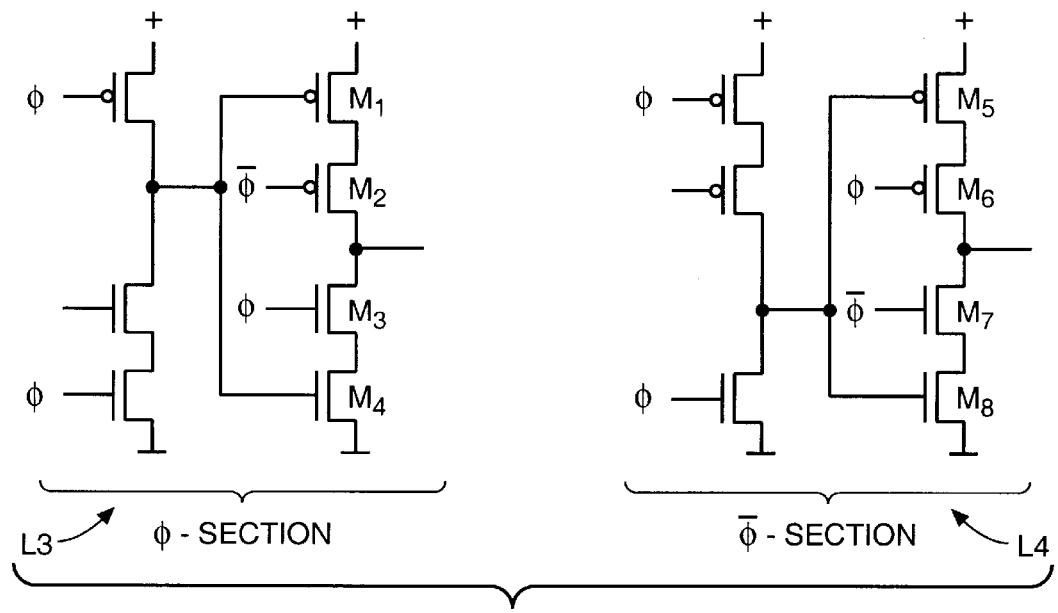
FIG._3A
(PRIOR ART)
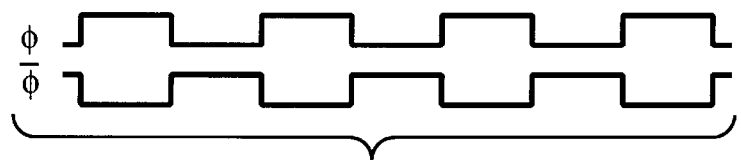
FIG._3B
(PRIOR ART)
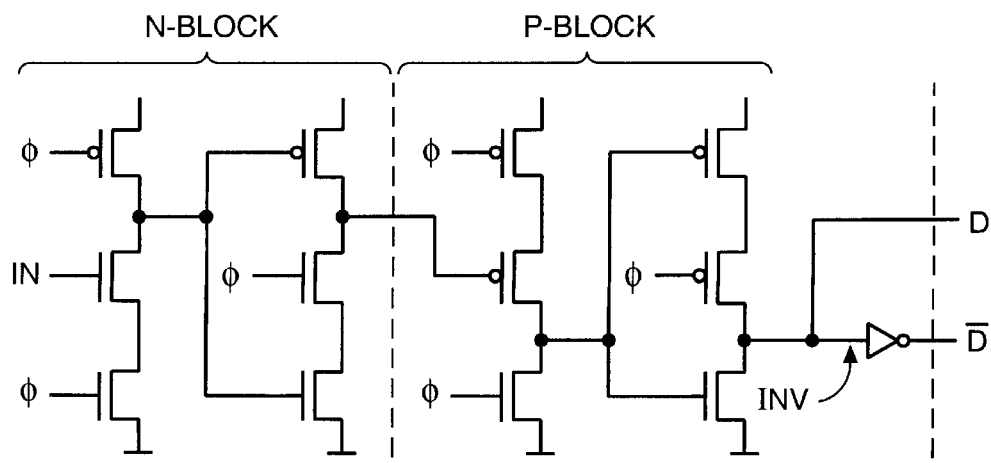
FIG._4
(PRIOR ART)

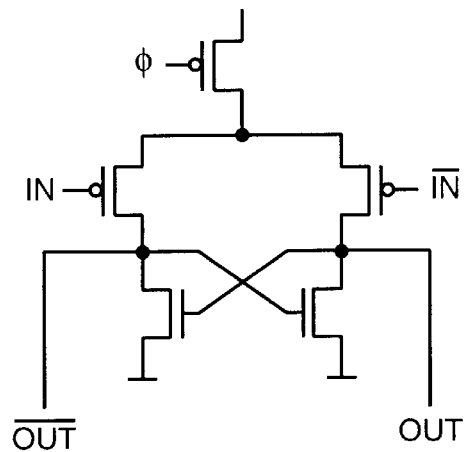
DSTC1(P)
FIG._5A
(PRIOR ART)
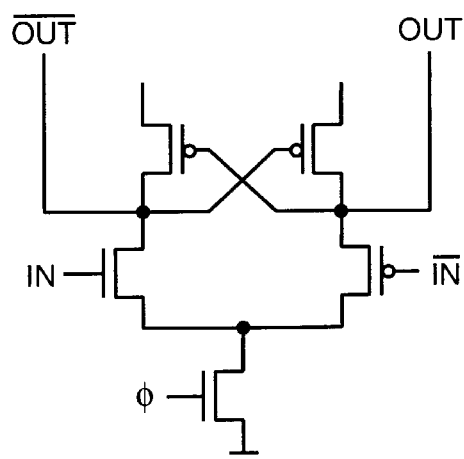
DSTC1(N)
FIG._5B
(PRIOR ART)
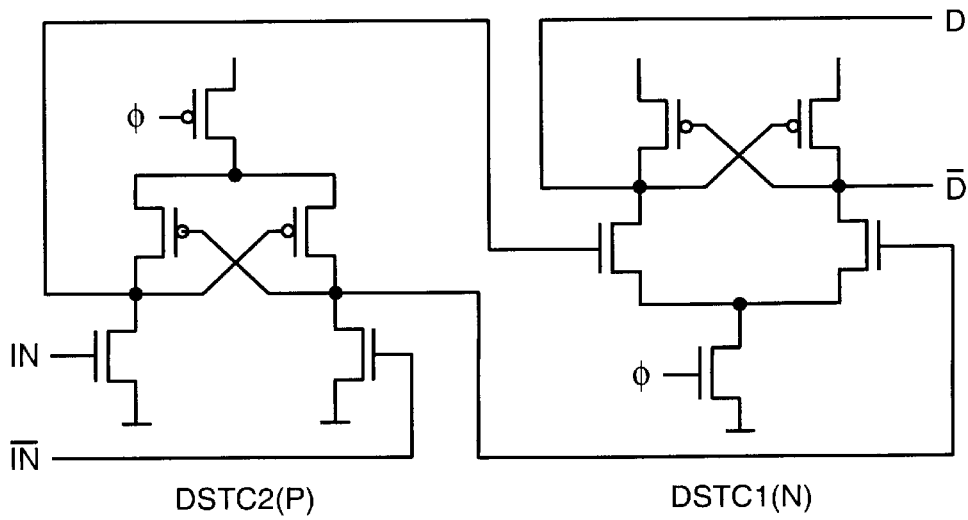
DSTC2(P)          DSTC1(N)
FIG._5C
(PRIOR ART)

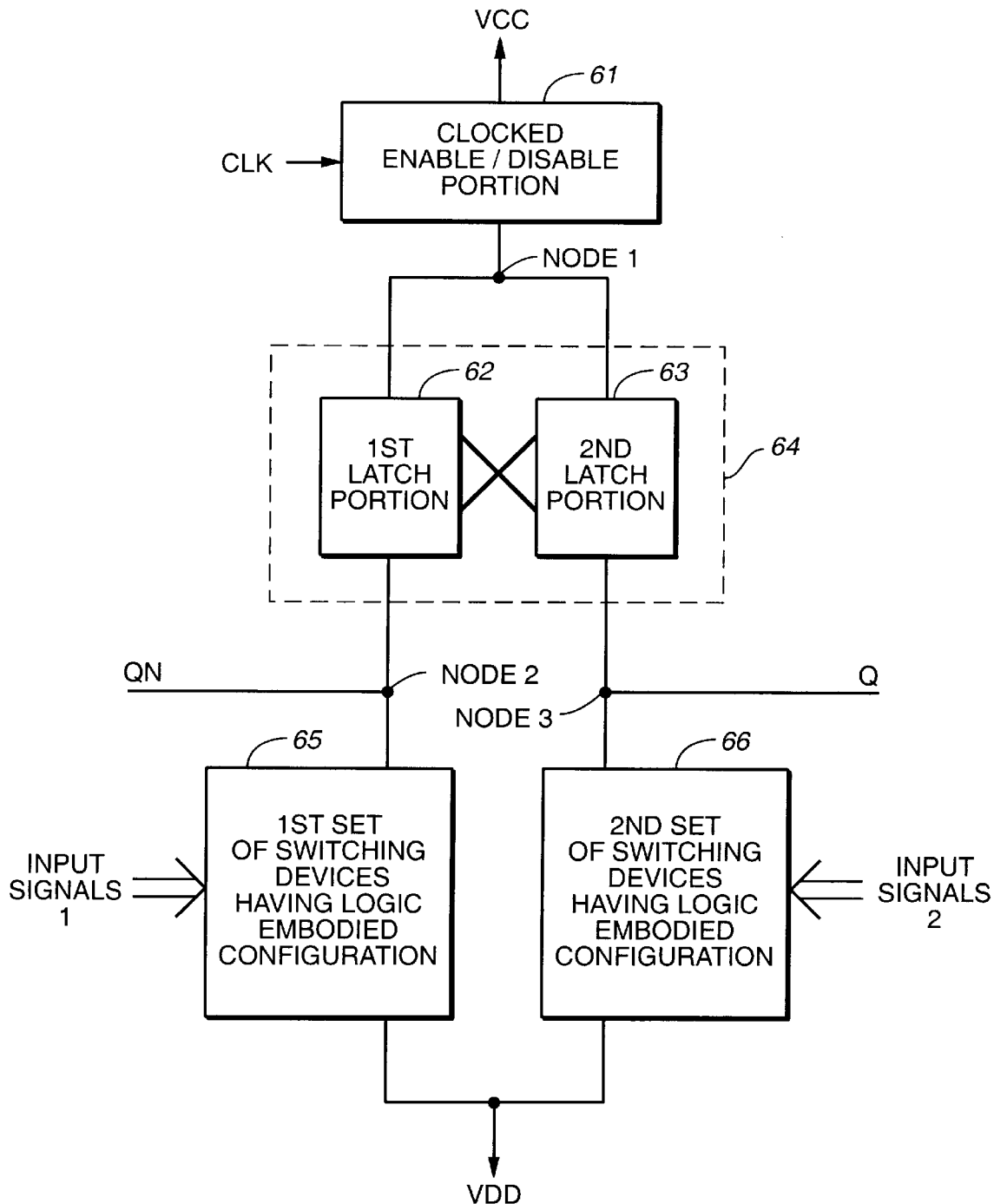
FIG._6

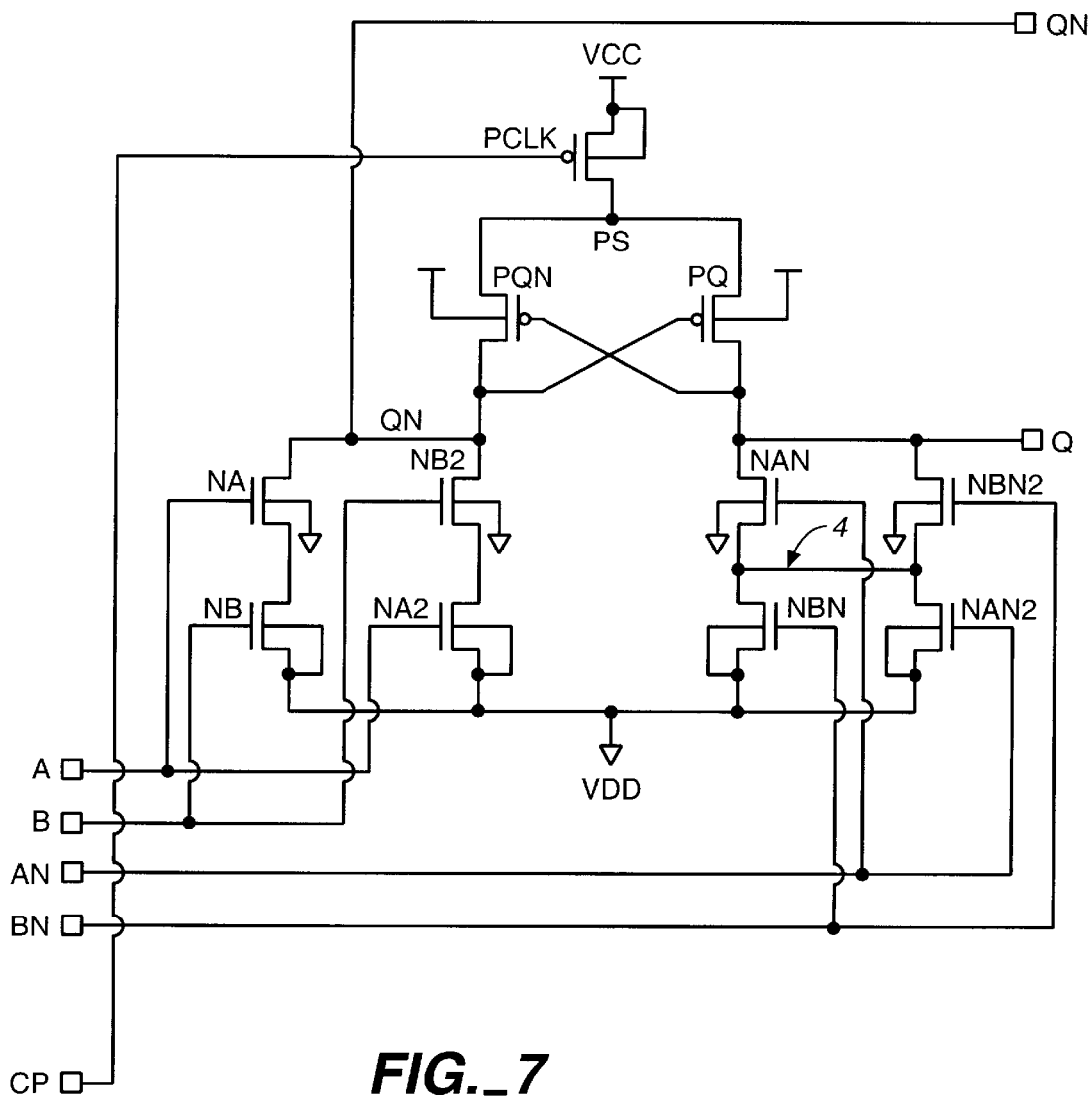
FIG._7

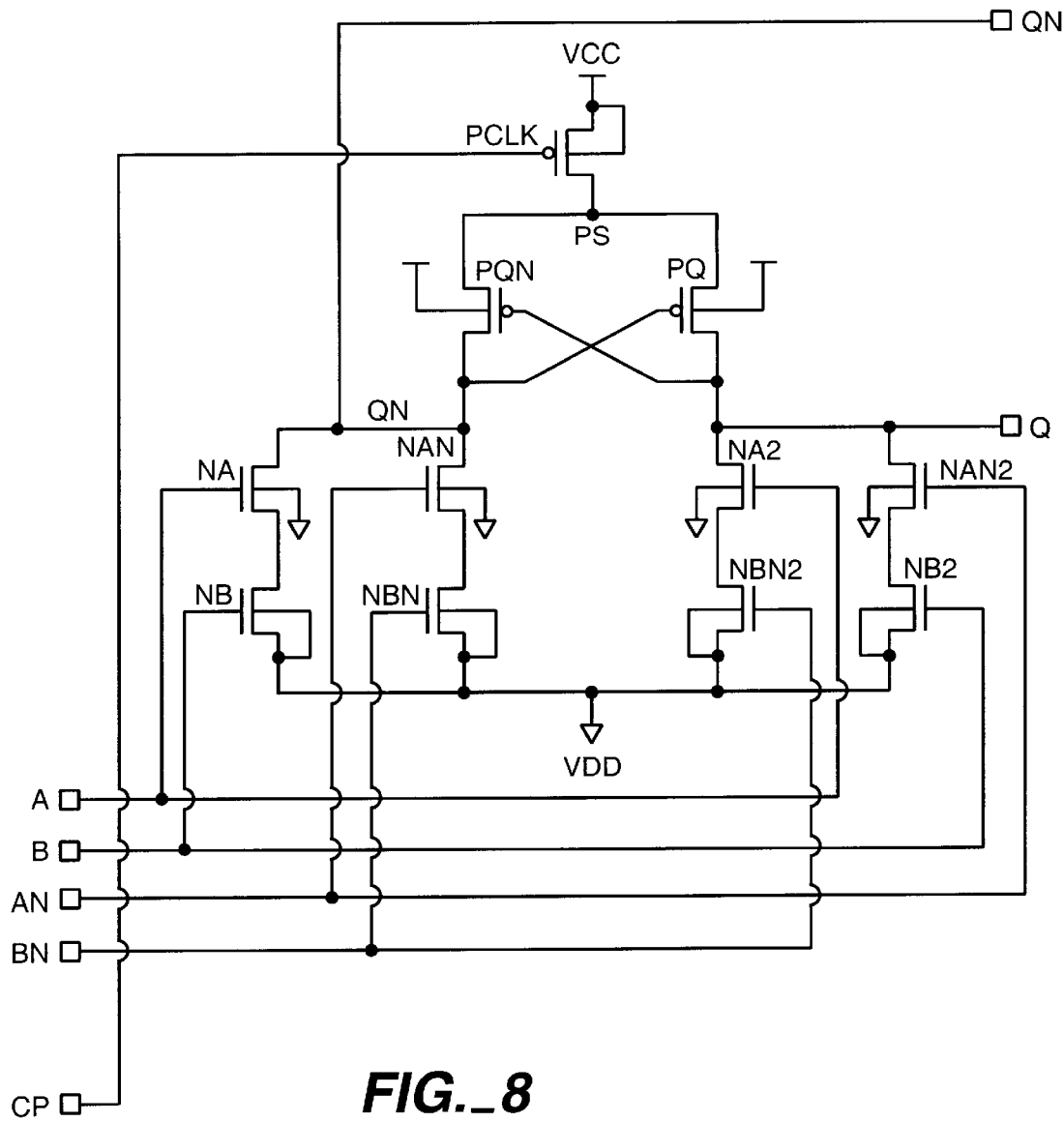
FIG._8

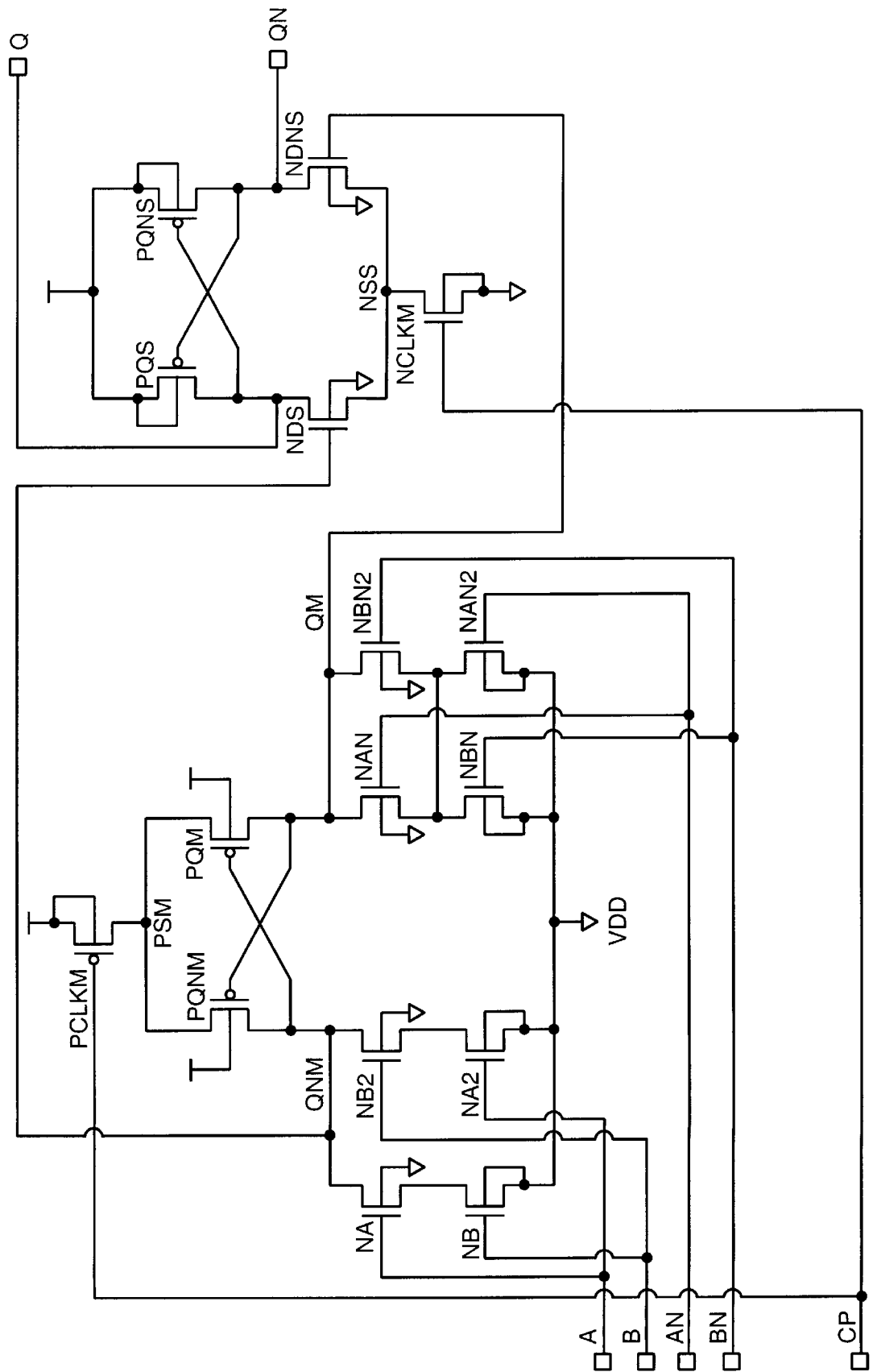
FIG._9

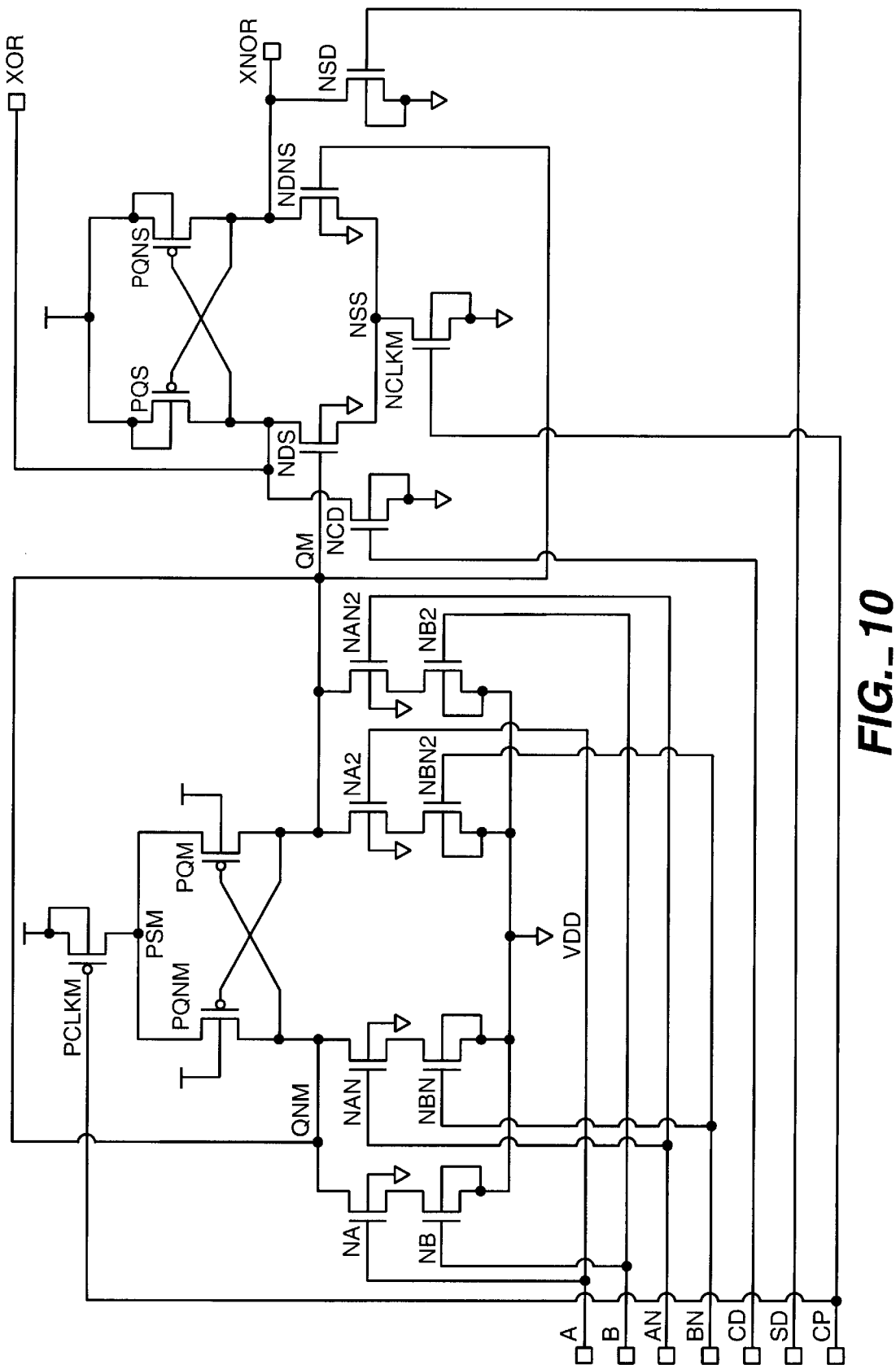
FIG._10

6,069,495

HIGH-SPEED LOGIC EMBODIED DIFFERENTIAL DYNAMIC CMOS TRUE SINGLE PHASE CLOCK LATCHES AND FLIP-FLOPS WITH SINGLE TRANSISTOR CLOCK LATCHES

BACKGROUND OF THE INVENTION

1. Field of the Invention

The present invention relates to latches and flip-flops, and more particularly to CMOS circuit designs of latches and flip-flops.

2. State of the Art

Latches and flip-flops are well known basic building blocks in synchronous logic circuit designs. In general, latches and flip-flops function as memory elements in that output voltage levels depend upon past as well as present voltage levels. The operation of sequential logic gates is such that when new inputs are applied, the outputs respond according to the new inputs and the previous inputs. Upon removal of the inputs, the outputs then remain unchanged. In particular, a latch can change output states continuously corresponding to input changes in any instant, whereas a flip-flop changes outputs states at instants controlled by a clock signal.

In general, flip-flops are formed by cascading two consecutive latch stages together (referred to as master and slave latches) that are clocked (i.e., enabled) at different times. FIG. 1 shows a typical implementation of a flip-flop having a master latch and a slave latch consecutively coupled and clocked such that the master latch and the slave latch are enabled at opposite clock phases.

Clock signals function to enable (or disable) the latches and flip-flops dependent on the voltage level or transition type (i.e., HIGH-to-LOW or LOW-to-HIGH) of the clock signal. Latches and flip-flops can be clocked in a variety of different manners requiring a varying number of clock signals. Some latch and flip-flop clocking techniques are described in an article entitled "High-Speed CMOS Circuit Technique" by Jiren Yuan and Christer Svensson (IEEE Journal of Solid State Circuits, Vol 24, No. 1, February 1989) and in an article entitled "New Single-Clock CMOS Latches and Flip-Flops with Improved Speed and Power Savings" by Jiren Yuan and Christer Svensson (IEEE Journal of Solid State Circuits, Vol 32, No. 1, January 1997).

In the sequential logic design shown in FIG. 2A including logic blocks 1 and 2 and latching stages L1 and L2, a clocked CMOS logic (i.e., $C^2MOS$) technique is used. In this technique, two non-overlapping clock signals, $\phi_1$ and $\phi_2$, and their complements, $\phi_1/$ and $\phi_2/$, (FIG. 2B) are used to clock latching stages L1 and L2. In this case, effectively four phases are used to clock the logic design.

In a second technique referred to as NORA dynamic CMOS technique, two phases, $\phi$ and $\phi/$, of a single clock signal is used (FIGS. 3A and 3B). In this case, latching stage L3 is clocked with the $\phi$ clock signal and latching stage L4 is clocked with the $\phi/$ clock signal. Latching stage L3 and L4 can be alternated within the logic design for sequential signal propagation such as shown in FIG. 2A.

The disadvantage of both of the above described techniques is that signal skews can develop when more than one clock is used and when a clock and its complement is used. In addition, these designs require additional logic elements to obtain inverted clock signals. The true single-phase clock (TSPC) dynamic CMOS circuit technique overcomes these disadvantages by using a single clock phase to clock latch stages. The latch stages are referred to as block or P-block depending on whether the clock is applied to an n or p type device. FIG. 4 shows an example of an N-block TSPC latch coupled to a P-block TSPC latch to form a flip-flop requiring a single clock signal $\phi$. This logic gate has a single ended input IN and provides non-inverted and inverted signals (D and D/) using inverter INV. In this case the two output signals are referred to as a pseudo differential output signal since the two signals are generated by inverting a single-ended output of the flip-flop instead of having two distinct output ports for providing a true differential signal. The advantage of having a differential output signal is that other logic blocks often require a signal and its complement to perform the desired logic function. Furthermore, using an inverter to provide pseudo differential outputs can introduce signal skews between input signals to subsequent stages unlike true differential signals.

Hence, in addition to clocking techniques, another important design aspect of latches and flip-flops is whether they are designed to provide a single-ended output (i.e., a single non-inverted output signal) or a differential output (i.e., a non-inverted output signal and its inverted complement). FIGS. 5A and 5B show differential input/output true single phase latches in which either a p-type device (FIG. 5A) or an n-type device (FIG. 5B) is used for clocking the latch. FIG. 5C shows a true single phase flip-flop implemented using the latches shown in FIGS. 5A and 5B.

As shown in FIG. 2A, synchronous logic is often implemented by alternating logic circuit stages which perform logic functions (e.g. Boolean logic) with logic circuit stages that perform latch (or flip-flop) functions. Hence, logic functions and latch or flip-flop functions are always performed by separate logic circuits which are alternately clocked. In this type of system it is often necessary to adapt differential and/or single-ended inputs and outputs when coupling the logic and latch stages to match previous and subsequent stage inputs. For instance, a latch stage may provide a single-ended output which needs to be converted to a differential output for the next stage. In addition, each separate stage takes a finite amount of time to perform its corresponding logic and latch (or flip-flop) function. Hence, the more stages used to implement the sequential logic, the longer it takes to process data through it. Consequently, although the true single phase clock logic technique has increased clocking speed, it still requires separate logic stages to be combined with the latching stages to implement a sequential logic circuit.

SUMMARY OF THE INVENTION

A differential true single phase logic embodied latch and flip-flop is described. The latch and flip-flop are designed so as to incorporate a logic function(s) within the latch thereby obviating subsequent or previous logic gates.

The latch includes a clocked enable/disable portion, a latch portion, and first and second logic embodied input switching device portions. The clocked enable/disable portion is coupled between VCC and a first node such that in a first phase of the clock signal the latch is enabled and in a second phase it is disabled. The latch portion, coupled between the enable/disable portion and the first and second outputs, functions to latch output states depending on the input states when the latch is enabled and to retain the output values when disabled. The first set of input switching devices, coupled between a first one of the outputs and ground, receives a first set of input signals which are a first combination of input signals and their complements. The second input switching devices receive a second set of second input signals, which are a second combination of input signals and their complements. The first and second input switching devices are configured so as to drive first and second outputs, respectively, with logic states corresponding to the results of logic functions performed on the first and second input signals in a single clock phase.

In a first embodiment of the latch of the present invention in which two non-inverted input signals A and B are coupled to the first input switching devices and the complement of the two non-inverted signals A/ and B/ are coupled to the second input switching devices, the first and second switching devices are configured so as to cause the latch to output on its non-inverted output the AND function of signals A and B (i.e., Q=A·B) and on its inverted output the complement of the AND (i.e., NAND function) function of signals A and B (i.e., Q=(A·B)/). In addition, this embodiment of the latch can perform other functions by reversing complementary inputs of each signal such that the A input signal is coupled to the A/ input of the latch, and visa versa and the B input signal is coupled to the B/ input of the latch and visa versa. In this case the non-inverted output signal is the complement of the OR function (i.e., NOR function) of signals A and B (i.e., Q=(A+B)/) and the inverted output signal is the OR function of signals A and B (i.e., Q/=A+B).

In a second embodiment of the present invention two non-inverted input signals A and B and the complement of the two non-inverted input signals A/ and B/ are coupled to each of the first and second input switching devices and the first and second switching devices are configured so as to cause the latch to output on its non-inverted output the exclusive OR (XOR) function of signals A and B (i.e., Q=A⊕B) and on its inverted output the complement of the XOR (i.e., XNOR) function of signals A and B (i.e., Q/=(A⊕B)/.

In addition, the logic embodied latch is designed to be balanced such that the sizing of the first and second sets of switching devices provides equal capacitive loading on the non-inverted and inverted outputs of the latch and symmetrical conductivity between the latch outputs and ground.

The master-slave logic embodied flip-flop of the present invention includes a master and a slave latch wherein the master latch of the flip-flop is designed as the logic embodied latch as described above. The differential output of the master latch is coupled to the differential input of a differential true single phase slave latch. A single clock is used to dynamically control the master and slave latches. In a first phase of the single clock signal, the master latch is enabled and the slave latch is disabled such that the master latch outputs a logical function of the input signals and latches it to its differential outputs (which are coupled to the differential inputs of the slave latch). In the second phase, the slave latch is enabled and the master is disabled such that the slave latch outputs the results of the logical function operation onto its differential output in the second phase. Hence, the logic embodied flip-flop provides the results from a logical function on the input signals and latches the results of the logical function to its output in a single clock cycle.

BRIEF DESCRIPTION OF THE DRAWINGS

The present invention may be further understood from the following written description in conjunction with the appended drawings. In the drawings:

FIG. 1 shows a typical prior art implementation of a master-slave flip-flop;

FIGS. 2A–2B shows a prior art logic sequence using clocked CMOS logic;

FIGS. 3A and 3B show prior art latches implemented using a two phase, single clock clocking technique;

FIG. 4 shows N-block and P-block true single phase latches having single-ended outputs;

FIGS. 5A–5C show prior art differential true single phase latches and prior art master-slave flip-flop implemented with differential true single phase latches;

FIG. 6 shows a block diagram of a first embodiment of the logic function embodied latch of the present invention;

FIG. 7 shows a first CMOS circuit implementation of the logic embodied latch having input switching devices configured to perform AND and NAND logical functions;

FIG. 8 shows a second CMOS circuit implementation of the logic embodied latch having input switching devices configured to perform XOR and XNOR logical functions;

FIG. 9 shows a first embodiment of a master-slave flip-flop including a master latch implemented as a logic function embodied latch of the present invention shown in FIG. 7 and a slave latch implemented as a differential true single phase latch;

FIG. 10 shows a second embodiment of a master-slave flip-flop including a master latch implemented as a logic function embodied latch of the present invention shown in FIG. 8 and a slave latch implemented as a differential true single phase latch.

DETAILED DESCRIPTION OF THE PREFERRED EMBODIMENTS

The present invention, in general, is a logic embodied differential true single phase (TSP) latch which has logic functions incorporated into its input devices, allowing it to perform a logic function on its input signals and latch the results of the logic function operation onto its output in a single clock phase. In addition, the present invention is a master-slave flip-flop in which the master latch portion of the flip-flop is implemented with the logic embodied latch and the slave latch portion is implemented as a differential true single phase latch.

FIG. 6 shows a first embodiment of the logic embodied latch. As can be seen, the latch of the present invention is a differential input and output latch in that it receives differential input signals 1 and 2 which include a set of input signals and their complements and outputs a differential output signal (Q and QN). In one embodiment, the latch receives more than one signal and their corresponding complements. Hence input signals 1 and 2 can each comprise signals A and B and signals A/ and B/ or any combinations of signals A and B, A/ and B/.

The logic embodied latch shown in FIG. 6 is a true signal phase latch in that it only requires a single phase for latching data to its output. Referring to FIG. 6 the latch includes a clocked enable/disable portion 61 coupled between VCC and Node 1. The clocked portion 61 is responsive to clock signal CLK such that in a first phase of the clock, the input signals can change state without affecting the output state of the latch (i.e., the latch is disabled). In a second phase of the clock, the latch is enabled such input signals 1 and 2 determine the latched output state of signals Q and Q/.

Coupled between node 1 and VDD are first and second circuit branches. The first branch receives input signals 1 which can include any combination of input signals and their complements depending on the logic function embodied into the latch. The second branch receives input signals 2 which can also include any combination of input signals and their complements depending on the logic function embodied into the latch.

Each of the branches includes a portion of a latch. Circuit branch 1 includes first latch portion 62 and branch 2 includes second latch portion 63. The first and second latch portions (62 and 63) are cross-coupled so as to effectively form latch 64. Latch 64 functions to latch the logic states Q and Q/ when the latch is enabled during the second phase.

Between each output node (node 2 and node 3) and ground each circuit branch includes a logic function embodied configuration of input switching devices. The input switching devices are for receiving the input signals and are configured so as to effectively perform a logic function on the input signals and their complements and drive its corresponding output with the results of the logic function. Branch 1 includes a first set of logic embodied input switching devices 65 each device for receiving a corresponding one of input signals 1. Furthermore, branch 2 includes a second set of logic embodied input switching devices 66 each device for receiving a corresponding one of input signals 2.

When the latch is enabled, each of the first and second logic embodied input switching devices drive their corresponding output node with the results of the logic function performed on the input signals. For instance, the first set of input switching devices drives node 2 with the QN=logic function (input signals 1) and the second set of input switching devices drives node 3 with the Q=logic function (input signals 2). In addition when the latch is enabled, the first and second latch portions latches the logic function results to the outputs.

In one embodiment, each of the clock enable/disable portion 61, the latch 64, and the first and second set of logic embodied configuration switching devices 65 and 66 are implemented using CMOS devices.

It should be understood that in prior art latches, data applied to the input of the latch essentially is passed to the output of the latch depending on the previous and present state of the latch and also depending on the clock phase. In some cases, latching takes more than one clock phase. Furthermore, logic functions are performed before and/or after the latch in previous and/or subsequent logic stages. In contrast to the prior art latches, the present invention does not simply pass data but instead performs logical functions on the data prior to driving the output nodes. Both of these functions are performed in a single clock phase. Hence, the latch of the present invention reduces the number of logic gates in a logic circuit as well as significantly increases the speed of the circuit.

FIG. 7 shows a first CMOS circuit implementation of the embodiment of the latch shown in FIG. 6 having specific functions embodied into the first and second input switching devices. The latch includes PMOS clocking device PCLK coupled between VCC and node 1 and having its input coupled to clock signal CP. Device PCLK functions such that when CP is LOW, it is conducting and node 1 is pulled to VCC thereby enabling the latch. When CP is HIGH, device PCLK is off and no conductive path exists between VCC and node 1 such that the latch is disabled. Devices PQN and PQ, coupled between node 1 and output nodes QN and Q, respectively, function as first and second cross-coupled latch portions as is well known in the field of circuit design.

As shown, the first set of logic embodied switching devices (NA, NB, NB2, and NA2) receive input signals A and B and the second set of logic embodied switching devices (NAN, NBN, NBN2, and NAN2) receive corresponding complementary input signals AN and BN.

The first set of switching devices NA, NB, NB2, and NA2 are coupled between output node QN and VDD. As shown, the first set of devices are configured into two parallel branches coupled between output node QN and VDD and in particular, devices NA and NB are coupled in series between QN and VDD and devices NB2 and NA2 are coupled in series between QN and VDD and are in parallel to devices NA and NB. The second set of logic embodied switching devices NAN, NBN, NBN2, NAN2, are similarly configured except for a connection between the source of each of devices NAN and NBN2 (node 4).

The configuration of the first set of input switching devices embodies a logic function such that when input signals A and B are coupled to the switching devices NA, NB, NB2, and NA2, output node QN is driven to a voltage level corresponding to the results of the logical function of the complement of signal A ANDed with signal B (i.e., Q/=(A·B)/). Similarly, the second set of input switching devices embodies a logic function such that when input signals AN and BN are coupled to the switching devices NA, NB, NB2, and NA2, output node Q is driven to the results of the logical function of the signal A ANDed with signal B (i.e., Q=A·B).

The following is an analysis of the latch shown in FIG. 7 illustrating how the first set of switching devices and the second set of switching devices realize the above indicated logic functions. Since devices NA and NB are in a stack, if signals A and B are both HIGH, both NA and NB are turned on, and QN is pulled LOW. If QN is LOW, then PQ is on, causing output Q to be pulled HIGH. Furthermore, when signals A and B are HIGH, their complements AN and BN are LOW and all four of the second set of switching devices are off such that no signal contention arises to pull Q LOW. Hence, in the case in which signals A and B are HIGH, Q is HIGH and QN is LOW satisfying a first condition of the AND function.

In the case in which any of A and B are LOW, then any one of AN and BN will be HIGH. Furthermore, in order for node Q to be pulled LOW it is necessary to have either NBN or NAN2 turned on and in addition, either NAN or NBN2 turned on. Signal AN is coupled to both NAN and NAN2, so if signal AN is HIGH (i.e., signal A is LOW), then both NAN and NAN2 are on and there is a path to ground such that Q is pulled LOW. Similarly, if signal BN is HIGH (i.e., signal B is LOW), then both NBN and NBN2 are on and there is a path to ground such that Q is pulled LOW. In addition, with Q LOW, PQN is turned on and node QN is pulled HIGH. Furthermore, if either of A or B are LOW, then there is no path to ground through devices stacks NA/NB and NB2/NA2 such that no signal contention arises to pull QN LOW.

Hence, if both of signals A and B are HIGH then Q is HIGH and if any of signals A and B are LOW (i.e., any of signals AN and BN are HIGH) then Q is LOW satisfying the A AND B function of the Q output.

It is also possible to obtain the NAND function (i.e., A·B)/) from output QN. In this case, if A and B are HIGH, then QN is LOW and if any of A and B are LOW then QN is HIGH.

Furthermore, if from the previous logic stage providing a differential input signal the A and AN inputs are interchanged and the B and BN inputs are interchanged, then Q then provides the NOR function and QN provides the OR function.

By embodying the logic into the input devices of the latch the logic embodied latch can provide both a logic function and a latch function in the same amount of time as the prior art true single phase latch provide only a latch function thereby representing a significant increase is speed when using the logic embodied latch in synchronous logic circuits.

The logic embodied latch is designed to be balanced in a number of different aspects to optimize its operation. In particular, all of the input devices NA, NB, NA2, NB2, NAN, NBN, NAN2, and NBN2 are all the same size. In addition, it should be noted that there are two possible paths to ground from QN: from NAN and NBN2 through either NBN and NAN2. In addition, there are two possible paths to ground from QN: through device stack NA and NB and through device stack NB2 and NA2. The second path NB2 and NA2 is a redundant path so as to ensure balanced capacitive loading on the output nodes Q and QN. In addition, since all of the devices are the same size, the conductivity path between each of Q and QN to ground is balanced. Also note that signals A, B, AN and BN are all coupled to two switching devices each. This provides balanced capacitive coupling to the previous stage.

FIG. 8 shows a second CMOS implementation of the logic embodied latch of the present invention. In this implementation, first and second logic embodied input CMOS devices are configured to perform the XOR function and the complement of the XOR function (i.e., XNOR).

If both signals A and B are HIGH, then devices NA, NB are both on and QN is pulled LOW also causing Q to be pulled HIGH by latch devices PQN and PQ as described above. Furthermore, no contention arises from devices NA2, NB2, NAN2, and NBN2 since if both signals A and B are HIGH, then signals AN and BN are LOW and both of devices NAN2 and NBN2 are off so that no path exists from Q to ground. Furthermore if both A and B are LOW (i.e., both AN and BN are HIGH) then devices NAN and NBN are both on and QN is pulled low also causing Q to be pulled HIGH by the latch as described above. Furthermore, no contention arises from devices NA2, NB2, NAN2, and NBN2 since if both signals A and B are LOW, then both of devices NA2 and NB2 are off so that no path exists from Q to ground.

In the case in which either one of signals A and B are HIGH and the other is LOW then signal A is the same as signal BN and signal B is the same as signal AN. The device stack including devices NA2 and NBN2 are coupled to signal A and signal BN, respectively. Hence in the case when signal A is HIGH, then signal BN is also HIGH and the output Q is pulled LOW. Similarly, The device stack including devices NAN2 and NB2 are coupled to signal B and signal AN, respectively such that when signal B is HIGH, then signal AN is also HIGH and the output Q is pulled LOW. QN is pulled HIGH by the latch devices in the same manner as described in FIG. 7. In addition, no contention arises from devices NA, NB, NA2, and NB2 since if one of signals A and B is HIGH and the other is LOW, then at least one device in each device stack will be off and no path exists from QN to ground.

As with the previous implementation, all of devices NA, NB, NAN, NBN, NA2, NAN2, NB2, and NBN2 are the same size thereby providing balanced conductive paths between each of the outputs and ground. In addition, the same number of switching devices are coupled between each output and ground such that there are two capacitive paths.

The logic embodied latches shown in FIGS. 6–8 can be implemented as a master latch in a master-slave flip-flop to form a logic embodied fully differential true single phase flip-flop (FIG. 9). As shown the QM (M denotes master) and QNM outputs of the logic embodied flip-flop is coupled to the corresponding NDS (S denotes slave) and NDNS inputs of the slave device. Also note that the slave latch comprises first and second cross-coupled latching devices PQS and PQNS and input devices NDS and NDNS coupled into first and second branches between VCC and node NSS. Clocking device NCLKM is coupled between node NSS and VDD and is the opposite conductivity as the PCKLM clock in the master latch. When the clock is in a first half of a clock cycle, the master latch is enabled and the slave latch is disabled. In this state, the master latch latches the differential output signals corresponding to the results of the embodied logic function to its outputs, QNM and QM. When the clock is in the second half of the clock cycle, the master latch is disabled and the slave latch is enabled. In this state, the slave latch receives the results of the embodied logic function and outputs the results on its differential outputs, Q and QN. Hence, the master-slave logic embodied flip-flop performs a logic function and latch function in a single clock cycle.

FIG. 10 shows a flip-flop that has its master latch implemented as the logic embodied latch shown in FIG. 8. Similar to the flip-flop shown in FIG. 9, the master latch is enabled when CP is in a first phase and the slave latch is enabled when CP is in its second phase. In addition, the slave latch as shown in FIG. 10 also includes asynchronous set and reset circuitry but it should be understood that this is not required to implement the flip-flop as shown in FIG. 10.

As described with respect to logic embodied latch shown in FIGS. 7 and 8, the master latch is electrically balanced in each of FIGS. 9 and 10 in several manners. First, the number of latches in a given stack, the number of stacks in either of the first and second circuit branches is the same, and each device has essentially the same dimensions so as to ensure equivalent conductivity paths from each output node to ground and to ensure balanced capacitance at each of nodes QN and QNM. In addition, the output signals QN and QNM are coupled to an equal number of devices in the slave latch thereby providing balanced capacitive loading to the master latch.

Furthermore signals A and AN/ and signals B and B/ are each applied to equal numbers of input devices. For instance, in FIG. 9, signal A is coupled to two devices NA and NB, signal B is coupled to devices NB2 and NA2, signal A/ is coupled to devices NAN and NAN2, and B/ is coupled to devices NBN and NBN2. Hence, this ensures balanced capacitive loading to the previous logic stage coupled to the master latch of the flip-flop.

Hence, the logic embodied latches and flip-flops shown in FIGS. 7–10 are designed to have both balanced conductive and capacitive internal and external loading which optimizes its operation when being employed in a sequential logic system.

In the preceding description, numerous specific details are set forth, such as specific device types in order to provide a thorough understanding of the present invention. It will be apparent, however, to one skilled in the art that these specific details need not be employed to practice the present invention. In other instances, well-known logic circuit theory has not been described in order to avoid unnecessarily obscuring the present invention.

Moreover, although the components of the present invention have been described in conjunction with certain embodiments, it is appreciated that the invention can be implemented in a variety of other ways. Consequently, it is to be understood that the particular embodiments shown and described by way of illustration is in no way intended to be considered limiting. Reference to the details of these embodiments is not intended to limit the scope of the claims which themselves recite only those features regarded as essential to the invention.

What is claimed is:

1. A logic circuit comprising:

a means for dynamically enabling and disabling said logic circuit, said dynamic enable/disable means coupled between a first working potential and a first node, and being responsive to a clock signal having a first and second phase such that in said first phase said logic circuit is enabled and in said second phase said logic circuit is disabled;

a latching portion coupled between said first node and first and second differential output nodes;

first and second circuit branches each coupled between said first and second differential output nodes, respectively, and a second working potential, said first branch having a first set of input switching devices for receiving a first combination of at least two differential signals, each differential signal including a non-inverted signal and a corresponding complement of said non-inverted signal and for driving said first differential output node with a first output signal having a first logic state which corresponds to the results of a first logical function of said at least two differential signals;

said second branch having a second set of input switching devices for receiving a second combination of said at least two differential signals and for driving said second differential output mode with a second output signal having a second logic state which corresponds to the results of a second logical function of said at least two differential signals;

wherein said first and said second logical functions are performed on said at least two differential signals and said first and said second output signals are latched to said first and second outputs in the same clock phase.

2. The circuit as described in claim 1 wherein said first set of switching devices comprises a first stack of devices including a first device and a second device coupled in series between said first differential output node and said second working potential said first stack of devices being in parallel with a second stack of devices including a third device and a fourth device coupled in series between said first differential output node and said second working potential; and said second set of switching devices comprises a third stack of devices including a fifth device and a sixth device coupled at a first common node in series between said second differential output node and said second working potential, said third stack of devices being in parallel with a fourth stack of devices including a seventh device and an eighth device coupled in series at a second common node between said second differential output node and said second working potential, said first common node being connected to said second common node.

3. The logic circuit as described in claim 2 wherein said first and second switching devices are implemented in CMOS devices.

4. The logic circuit as described in claim 3 wherein each of said first and second sets of input switching devices include series coupled stacks of devices and the number of each of said first and second input switching devices is the same and said first and second switching devices have associated device dimensions that are essentially the same such that an equal number of conductive paths exists from said first differential output node and ground and from said second differential output node and ground and such that each of said first and second differential outputs have essentially the same capacitive loading.

5. The circuit as described in claim 2 wherein each of said input signals and their corresponding complements are coupled to an equal number of said first and second input switching devices.

6. The circuit as described in claim 2 wherein each of said first and second output signals are coupled to an equal number of input devices in a subsequent logic stage.

7. The circuit as described in claim 2 wherein said first combination of said at least two differential signals includes a first non-inverted signal corresponding to a first differential signal and a second non-inverted signal corresponding to a second differential signal and said first non-inverted signal is coupled to the gate of said first and said fourth devices and said second non-inverted signal is coupled to the gate of said second and said third devices wherein said first set of input switching devices being configured so that said first logical function is the AND function of said first and said second non-inverted signals; and wherein said second combination of said at least two differential signals includes said corresponding complement of said first non-inverted signal and said corresponding complement of said second non-inverted signal and said complement of said first non-inverted signal is coupled to the gate of said fifth and said eighth devices and said complement of said second non-inverted signal is coupled to the gate of said sixth and said seventh devices wherein said second set of input switching devices being configured so that said second logical function is the NAND function of said first and said second non-inverted signals.

8. The logic circuit as described in claim 2 wherein said first combination of said at least two differential signals includes a corresponding complement of a first non-inverted signal corresponding to a first differential signal and a corresponding complement of a second non-inverted signal corresponding to a second differential signal and said corresponding complement of said first non-inverted signal is coupled to the gate of said first and said fourth devices and said corresponding complement of said second non-inverted signal is coupled to the gate of said second and said third devices, wherein said first logical function is the OR function of said first and second non-inverted signals, and wherein said second combination of said at least two differential signals includes said first non-inverted signal and said second non-inverted signal and said first non-inverted signal is coupled to the gate of said fifth and said eighth devices and said second non-inverted signal is coupled to the gate of said sixth and said seventh devices and wherein said second logical function is the NOR function of said first and second non-inverted signals.

9. The logic circuit as described in claim 1 wherein said first set of switching devices comprises a first stack of devices including a first device and a second device coupled in series between said first differential output node and said second working potential, said first stack of devices being in parallel with a second stack of devices including a third device and a fourth device coupled in series between said first differential output node and said second working potential; and said second set of switching devices comprises a third stack of devices including a fifth device and a sixth device coupled in series between said second differential output node and said second working potential, said third stack of devices being in parallel with a fourth stack of devices including a seventh device and an eighth device coupled in series between said second differential output node and said second working potential.

10. The circuit as described in claim 9 wherein said first combination of said at least two differential signals includes a first non-inverted signal corresponding to a first differential signal and its corresponding complement and a second non-inverted signal corresponding to a second differential signal and its corresponding complement and wherein said first non-inverted signal is coupled to the gate of said first device, said second non-inverted signal is coupled to the gate of said second device, said corresponding complement of said first non-inverted signal is coupled to the gate of said third device, and said corresponding complement of second non-inverted signal is coupled to the gate of said fourth device, and wherein said first set of input switching devices being configured so that said first logical function is the XOR function of said first and second non-inverted signals; and said second combination of said at least two differential signals includes said first non-inverted signal and said corresponding complement of said first non-inverted signal and said second non-inverted signal and said corresponding complement of said second non-inverted signal and wherein said first non-inverted signal is coupled to the gate of said fifth device, said second non-inverted signal is coupled to the gate of said eighth device, said corresponding complement of said first non-inverted signal is coupled to the gate of said seventh device, and said corresponding complement of second non-inverted signal is coupled to the gate of said sixth device and wherein said second set of input switching devices being configured so that said second logical function is the XNOR function of said first and second non-inverted signals.

11. A logic circuit comprising:

a single clock signal having first and second clock phases;

a master latch for receiving two differential input signals each including a non-inverted signal and its corresponding complement and outputting a differential output signal including a non-inverted output signal and a corresponding complement of said non-inverted output signal, said master latch being enabled during said first phase of said clock signal;

a slave latch having inverted and non-inverted input ports coupled to said non-inverted output signal and said corresponding complement of said non-inverted output signal, respectively, said slave latch being enabled during said second phase such that it latches to its non-inverted and inverted output ports said non-inverted output signal and said corresponding complement of said non-inverted output signal;

said master latch comprising:

a means for dynamically enabling and disabling said master latch, said dynamic enable/disable means coupled between a first working potential and a first node and being responsive to said clock having a first and second phase such that in said first phase said master latch is enabled and in said second phase said master latch is disabled;

a latching portion coupled between said first node and first and second differential output nodes of said master latch;

first and second circuit branches each coupled between said first and second differential output nodes of said master latch, respectively, and a second working potential, said first branch having a first set of input switching devices for receiving a first combination of said two differential input signals and for driving said first differential output node with one of said first non-inverted output signal and said corresponding complement of said non-inverted output signal having a first logic state which corresponds to the results of a first logical function of said two differential input signals;

said second branch having a second set of input switching devices for receiving a second combination of said two differential input signals and for driving said second differential output node with the other of said first non-inverted output signal and said corresponding complement of said non-inverted output signal having a second logic state which corresponds to the results of a second logical function of said two differential input signals;

wherein said first and said second logical functions are performed on said two differential signals and said first non-inverted output signal and said corresponding complement of said non-inverted output signal are latched to said first and second differential output nodes of said master latch in the same clock phase.

12. The circuit as described in claim 11 wherein said first set of switching devices comprises a first stack of devices including a first device and a second device coupled in series between said first differential output node and said second working potential, said first stack of devices being in parallel with a second stack of devices including a third device and a fourth device coupled in series between said first differential output node and said second working potential; and said second set of switching devices comprises a third stack of devices including a fifth device and a sixth device coupled at a first common node in series between said second differential output node and said second working potential, said third stack of devices being in parallel with a fourth stack of devices including a seventh device and an eighth device coupled in series at a second common node between said second differential output node and said second working potential, said first common node being connected to said second common node.

13. The logic circuit as described in claim 12 wherein said first and second switching devices are implemented in CMOS devices.

14. The logic circuit as described in claim 13 wherein each of said first and second sets of input switching devices include series coupled stacks of devices and the number of each of said first and second input switching devices is the same and said first and second switching devices have associated device dimensions that are essentially the same such that an equal number of conductive paths exists from said first differential output node and ground and from said second differential output node and ground and such that each of said first and second differential outputs have essentially the same capacitive loading.

15. The circuit as described in claim 12 wherein each of said first non-inverted and first inverted differential input signals are coupled to an equal number of said first and second input switching devices.

16. The circuit as described in claim 12 wherein each of said first non-inverted and first inverted differential output signals are coupled to an equal number of input devices in said latch stage.

17. The circuit as described in claim 12 wherein said first combination of said two differential input signals includes a first non-inverted input signal corresponding to a first differential input signal and a second non-inverted input signal corresponding to a second differential input signal and said first non-inverted input signal is coupled to the gate of said first and said fourth devices and said second non-inverted input signal is coupled to the gate of said second and said third devices wherein said first set of input switching devices being configured so that said first logical function is the AND function of said first and said second non-inverted input signals; and wherein said second combination of said two differential input signals includes said corresponding complement of said first non-inverted input signal and said corresponding complement of said second non-inverted input signal and said complement of said first non-inverted input signal is coupled to the gate of said fifth and said eighth devices and said complement of said second non-inverted input signal is coupled to the gate of said sixth and said seventh devices wherein said second set of input switching devices being configured so that said second logical function is the NAND function of said first and said second non-inverted input signals.

18. The logic circuit as described in claim 12 wherein said first combination of said two differential input signals includes a corresponding complement of a first non-inverted input signal corresponding to a first differential input signal and a corresponding complement of a second non-inverted input signal corresponding to a second differential input signal and said corresponding complement of said first non-inverted input signal is coupled to the gate of said first and said fourth devices and said corresponding complement of said second non-inverted input signal is coupled to the gate of said second and said third devices, wherein said first logical function is the OR function of said first and second non-inverted input signals; and wherein said second combination of said two differential signals includes said first non-inverted input signal and said second non-inverted input signal and said first non-inverted input signal is coupled to the gate of said fifth and said eighth devices and said second non-inverted input signal is coupled to the gate of said sixth and said seventh devices, wherein said second logical function is the NOR function of said first and second non-inverted input signals.

19. The logic circuit as described in claim 11 wherein said first set of switching devices comprises a first stack of devices including a first device and a second device coupled in series between said first differential output node and said second working potential, said first stack of devices being in parallel with a second stack of devices including a third device and a fourth device coupled in series between said first differential output node and said second working potential; and said second set of switching devices comprises a third stack of devices including a fifth device and a sixth device coupled in series between said second differential output node and said second working potential, said third stack of devices being in parallel with a fourth stack of devices including a seventh device and an eighth device coupled in series between said second differential output node and said second working potential.

20. The circuit as described in claim 19 wherein said first combination of said two differential input signals includes a first non-inverted input signal corresponding to a first differential input signal and its corresponding complement and a second non-inverted input signal corresponding to a second differential input signal and its corresponding complement and wherein said first non-inverted input signal is coupled to the gate of said first device, said second non-inverted input signal is coupled to the gate of said second device, said corresponding complement of said first non-inverted input signal is coupled to the gate of said third device, and said corresponding complement of second non-inverted input signal is coupled to the gate of said fourth device and said first set of input switching devices being configured so that said first logical function is the XOR function of said first and second non-inverted input signals; and said second combination of said two differential input signals includes said first non-inverted input signal and said corresponding complement of said first non-inverted input signal and said second non-inverted input signal and said corresponding complement of said second non-inverted input signal and wherein said first non-inverted input signal is coupled to the gate of said fifth device, said second non-inverted input signal is coupled to the gate of said eighth device, said corresponding complement of said first non-inverted input signal is coupled to the gate of said seventh device, and said corresponding complement of second non-inverted input signal is coupled to the gate of said sixth device and wherein said second set of input switching devices being configured so that said second logical function is the XNOR function of said first and second non-inverted input signals.

* * * * *